United States Patent [19]
Su et al.

[11] Patent Number: 5,327,016
[45] Date of Patent: Jul. 5, 1994

[54] LOAD CONTROL CIRCUIT INCLUDING AUTOMATIC AC/DC DISCERNMENT

[75] Inventors: Stephen Su; Warren J. Schultz, both of Tempe; Lloyd Hayes, Mesa, all of Ariz.

[73] Assignee: Motorola, Inc., Schaumburg, Ill.

[21] Appl. No.: 864,102

[22] Filed: Apr. 6, 1992

[51] Int. Cl.$^5$ .............................................. H03K 5/22
[52] U.S. Cl. ...................................... 307/128; 307/231
[58] Field of Search ....................... 361/88, 90–93; 307/128, 72, 73, 21, 22, 26, 231, 236; 323/319; 364/487; 328/149; 324/115

[56] References Cited

U.S. PATENT DOCUMENTS

| | | | |
|---|---|---|---|
| 1,103,693 | 7/1914 | Shedd | 307/128 |
| 3,903,375 | 9/1975 | DeWit | 379/379 |
| 4,520,310 | 5/1985 | Kelly et al. | 324/115 |
| 5,119,019 | 6/1992 | George | 324/115 |
| 5,142,221 | 8/1992 | Meldrum et al. | 324/115 |
| 5,225,660 | 6/1993 | Mita et al. | 219/130.51 |
| 5,250,893 | 10/1993 | Gambill et al. | 324/115 |

Primary Examiner—Jeffrey A. Gaffin
Assistant Examiner—Richard T. Elms
Attorney, Agent, or Firm—Bradley J. Botsch, Sr.

[57] ABSTRACT

A control circuit for switching AC or DC loads and for automatically discerning the presence of an AC or a DC power supply via a switch has been provided. The control circuit is coupled to alternately render a switch operative and non-operative wherein the switch is coupled across a load which is powered up by either an AC or a DC power supply. The control circuit includes an AC/DC discernment circuit for ascertaining whether the load is powered up by an AC or a DC power supply. The control circuit also includes circuitry for comparing signals sensed by the switch with predetermined thresholds (which are a function of whether an AC or DC determination has been made) for providing logic signals to control the operation of the switch.

7 Claims, 11 Drawing Sheets

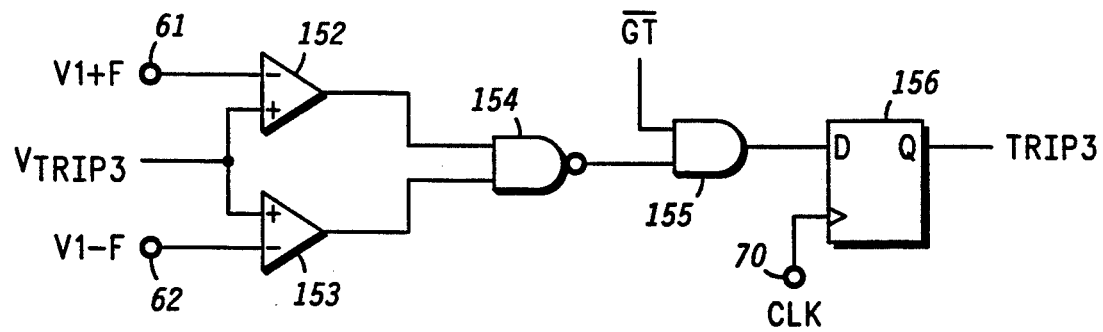
FIG. 9
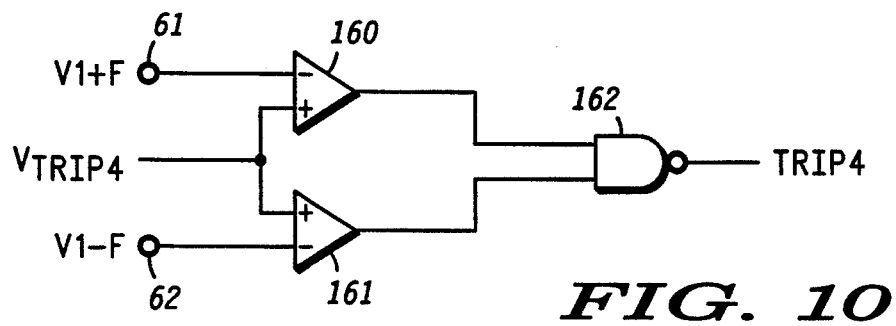
FIG. 10
FIG. 11
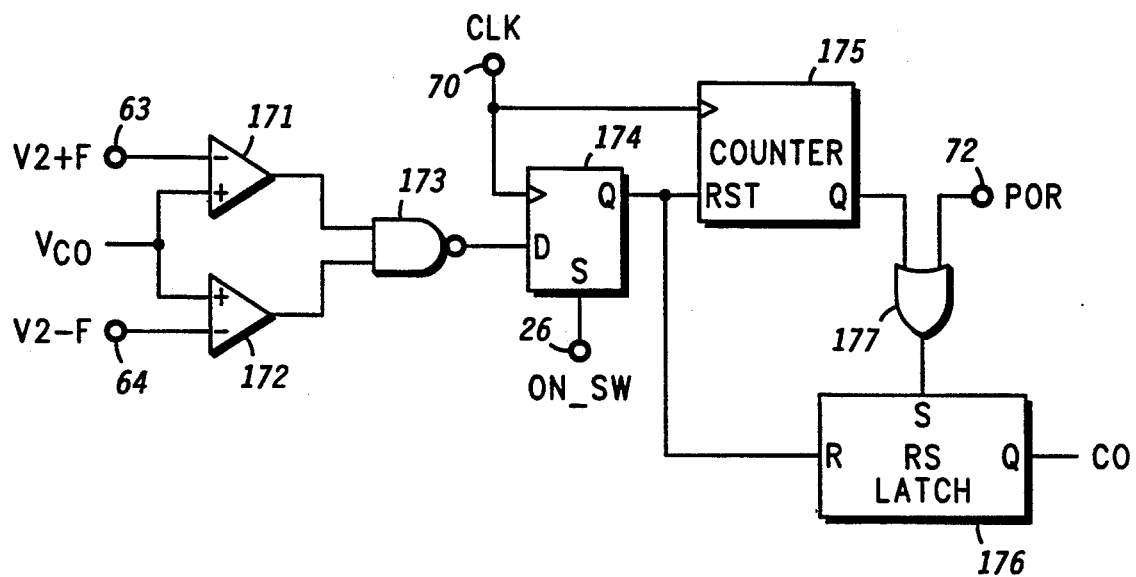

LOAD CONTROL CIRCUIT INCLUDING AUTOMATIC AC/DC DISCERNMENT

FIELD OF THE INVENTION

This invention relates to control circuits and, in particular, to an integrated circuit for controlling a load that may be coupled to an AC or DC power supply.

BACKGROUND OF THE INVENTION

When controlling a load that may be coupled to either an AC or DC power supply, different thresholds are typically desired to measure overcurrent conditions to enhance status reporting and self protection capability. For example, if the power supply is AC, a higher peak current can be tolerated through the load before switching the load off than if the power supply is DC. Thus, it is desirable to have two different thresholds which would be dependent on whether the load was coupled to an AC power supply or DC power supply. This creates a need to have an accurate AC/DC discernment circuit that adequately ascertains whether the load is coupled to an AC or a DC power supply.

A typical method of AC/DC discernment is to simply count the number of zero crossings on the power supply line. If a sufficient number of crossing occur, then an AC discernment is made. However, this may give false discernments especially in a noisy environment.

Hence, there exists a need for an improved load control circuit which includes automatic AC/DC discernment.

SUMMARY OF THE INVENTION

Briefly, there is provided a control circuit for alternately rendering a switch operative and non-operative, the switch being coupled to a load and a power supply, the switch providing a plurality of sense voltages in response to the signal level of the power supply, the control circuit comprising an AC/DC discernment circuit being responsive to one of the plurality of sense voltages of the switch for providing an output signal indicative of whether the power supply is providing an AC or DC signal. The control circuit also includes means responsive to the output signal of the AC/DC discernment circuit for providing a control signal to the switch for alternately rendering the switch operative and non-operative.

The present invention will be better understood from the following detailed description taken in conjunction with the accompanying drawings.

BRIEF DESCRIPTION OF THE DRAWINGS

FIGS. 9 and 10 are block diagrams illustrating comparator circuits for use within the load current comparator block shown in FIG. 1;

FIG. 11 is a block diagram illustrating at least one implementation of an open load detector for use within the open load detector block shown in FIG. 1;

DETAILED DESCRIPTION OF THE DRAWINGS

Figure 1:
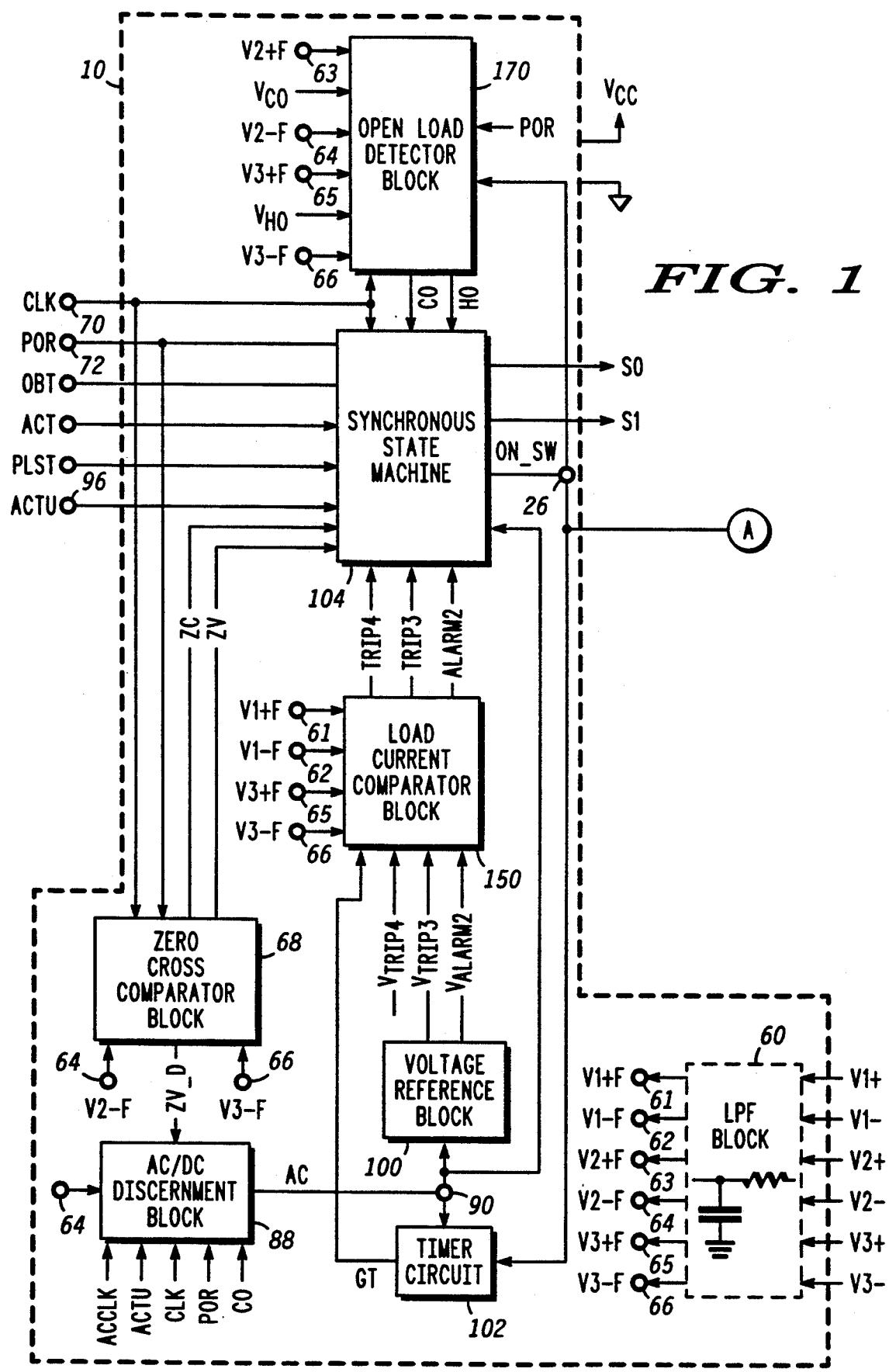
FIGS. 1 and 2 comprise a block diagram illustrating a control circuit having AC/DC discernment for controlling a load in accordance with the present invention.
Figure 2:
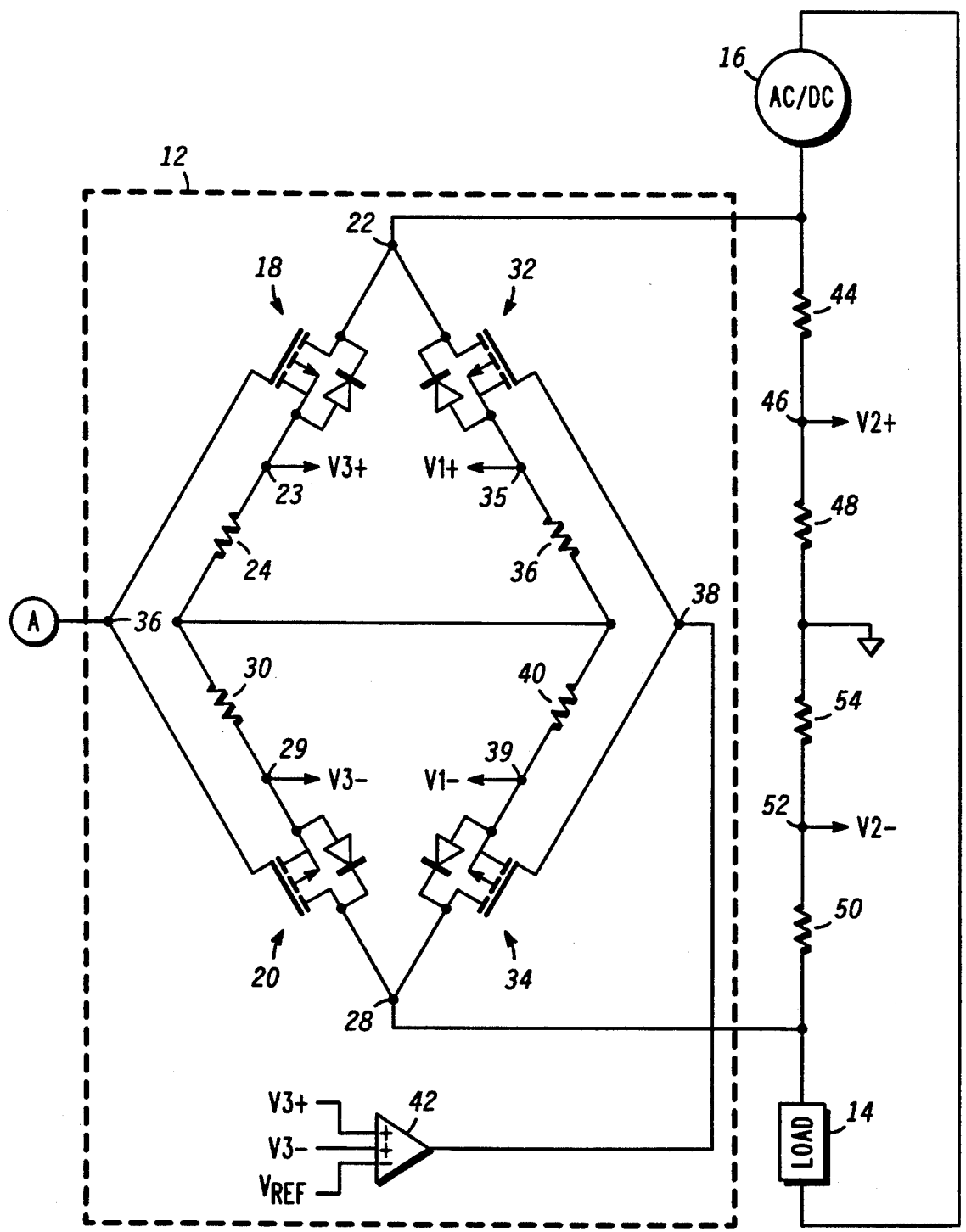

Referring to FIGS. 1 and 2, a block diagram illustrating control circuit 10 for driving field effect transistor (FET) bridge switch 12. FET bridge switch 12 is coupled to load 14 and to power supply 16 wherein load 14 may be a motor and power supply 16 may be an AC or DC power supply. Thus, control circuit 10 is utilized to control load 14 via rendering switch 12 operative or inoperative.

In particular, referring to FIG. 2, FET bridge switch 12 includes small signal MOSFETs 18 and 20. A first current carrying electrode of MOSFET 18 is coupled to circuit node 22, while a second current carrying electrode of MOSFET 18 is coupled to circuit node 23 at which the sense voltage V3+ appears. Circuit node 23 is further coupled through resistor 24 to a ground reference which is a floating ground reference. Further, it should be understood that all ground references discussed herein are intended to refer this floating ground reference. The control electrode of MOSFET 18 is coupled to terminal 26. Likewise, MOSFET 20 has a first current carrying electrode coupled to circuit node 28, and a second current carrying electrode coupled to circuit node 29 at which the sense voltage V3− appears. Circuit node 29 is further coupled through resistor 30 and returned to floating ground. The control electrode of MOSFET 20 is coupled to terminal 26. It is understood that MOSFETs 18 and 20 include built-in body diodes as illustrated.

FETs switch bridge 12 also includes power MOSFETs 32 and 34 which also include built-in body diodes as shown. Similar to MOSFET 18, MOSFET 32 has a first current carrying electrode coupled to circuit node 22 and a second current carrying electrode coupled to circuit node 35 at which the sense voltage V1+ appears. Circuit node 35 is further coupled through resistor 36 and returned to floating ground reference. The control electrode of MOSFET 32 is coupled to circuit node 38. Also, similar to MOSFET 20, MOSFET 34 has a first current carrying electrode coupled to circuit node 28 and a second current carrying electrode coupled to circuit node 39 at which the sense voltage V1— appears. Circuit node 39 is further coupled through resistor 40 and returned to floating ground reference. The current carrying electrode of MOSFET 40 is coupled to circuit node 38.

FET switch bridge 12 also includes operational amplifier (op amp) 42 which has first and second inputs respectively coupled to receive voltages V3+ and V3—. Also, op amp 42 has a third input for receiving reference voltage $V_{REF}$. The output of op amp 42 is coupled to circuit node 38.

It is worth noting that FET's 18, 20, 32 and 34 may be fabricated on separate semiconductor chips, and that op amp 42 may be incorporated onto a semiconductor chip which includes control circuit 10.

Circuit node 22 is coupled to a first terminal of power supply 16 and through resistor 44 to circuit node 46 at which the sense voltage V2+ appears. Circuit node 46 is returned to floating ground through resistor 48. Likewise, circuit node 28 is coupled to a first terminal of load 14 and through resistor 50 to circuit node 52 at which the sense voltage V2— appears. Circuit node 52 is coupled through resistor 54 and returned to floating ground. Also, the second terminal of power supply 16 is coupled to the second terminal of load 14.

Switch 12 operates such that when the voltage appearing at terminal 26 is below the threshold voltage of FETs 18 and 20, and the voltage appearing at circuit node 38 is below the threshold voltage of FETs 32 and 34, switch 12 is rendered inoperative due to the blocking built-in diodes. Further, no sense voltages appear at circuit nodes 23, 29, 35 and 39. But note that when FET bridge switch 12 is rendered inoperative, either voltage V2+ or voltage V2— will be a positive voltage with respect to floating ground depending upon the direction of the load current. Therefore, it can be said that voltages V2+ and V2— are utilized to sense the voltage across the load when switch 12 is inoperative.

However, when the voltage appearing at terminal 26 reaches the device threshold of FET's 18 and 20, FETs 18 and 20 are rendered operative and depending upon the direction of current flow either voltage V3+ or V3— will be a positive voltage available for sensing low current. Furthermore, as the load current increases, either voltage V3+ or voltage V3— will approach $V_{REF}$. As either one of the voltages rise above voltage $V_{REF}$, op amp 42 will function in the linear mode and turn on FETs 32 and 34 thereby allowing excessive load circuit to begin to flow through FETs 32 and 34. Further, an increase in the load current will eventually cause op amp 42 to fully turn on FETs 32 and 34 thereby allowing most of the load current to flow through transistors 32 and 34 because the total resistance of resistors 24 and 30, and FET's 18 and 20 is much greater than the total resistance of resistors 36 and 40, and FET's 32 and 34. Thus, it can be said that the left side of the FET bridge including FETs 18 and 20 is the low current sense side, while the right side of FET bridge 12 which includes FETs 32 and 34 is the high current sense side.

Turning back to control circuit 10 of FIG. 1, low pass filter block 60 includes a plurality of low pass filters for filtering sense voltages V1+, V1—, V2+, V2—, V3+ and V3— for respectively providing filtered outputs at terminals 61-66 at which signals V1+F, V1—F, V2+F, V2—F, V3+F and V3—F appear.

Zero crossing comparator block 68 receives voltages V2—F and V3—F as inputs and provides output signals ZC, ZV and ZV_D. Zero crossing comparator circuit 68 also receives signal CLK (the system clock) which is applied at terminal 70, and signal POR (power on reset) which is applied at terminal 72.

Figure 3:
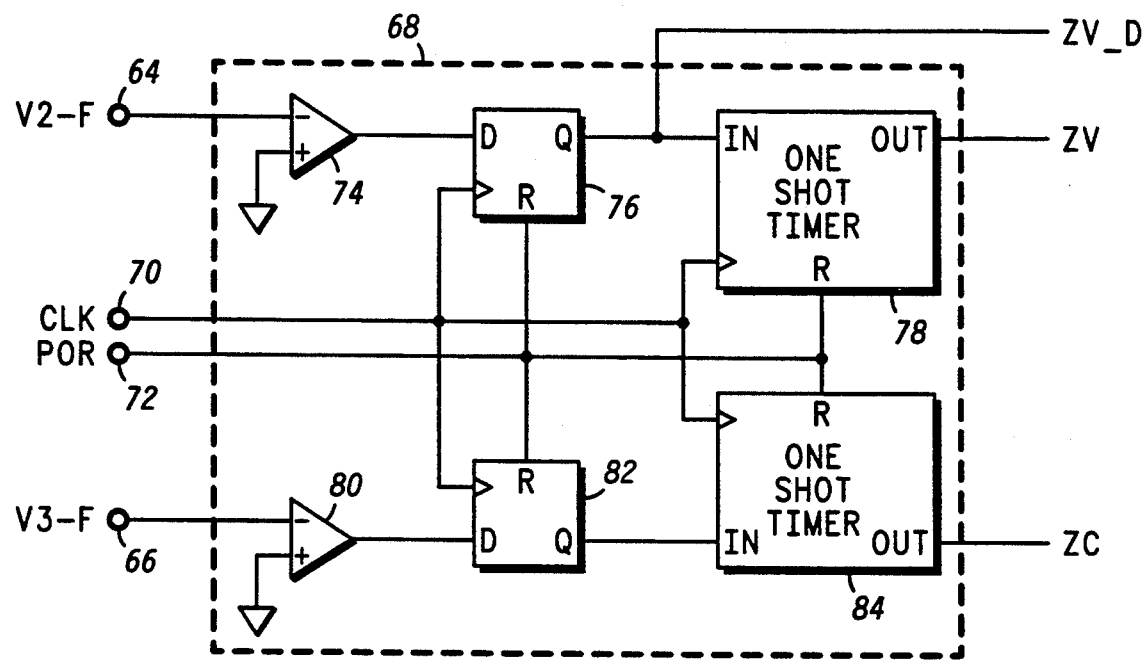
FIG. 3 is a block diagram illustrating one implementation of the zero crossing comparator block shown in FIG. 1.

Turning to FIG. 3, a detailed block diagram illustrating one implementation of zero crossing comparator block 68 is shown. It is understood that components shown in FIG. 3 which are identical to components shown in FIG. 1 are identified by the same reference numbers. The block diagram of FIG. 3 includes a comparator circuit 74 having an inverting input coupled to terminal 64 and a non-inverting input returned to floating ground. The output of comparator circuit 74 is coupled to the data input of flip flop 76, the output of which is coupled to the input of one shot timer 78. Also, the output of flip flop 76 provides output signal ZV_D. Further, the output of one shot timer 78 provides signal ZV. Similarly, comparator circuit 80 has an inverting input coupled to terminal 66 and a non-inverting input returned to floating ground. The output of comparator circuit 80 is coupled to the data input of flip flop 82, the latter having an output coupled to the input of one shot timer 84. Further, the output of one shot timer 84 provides signal ZC.

In addition, signal CLK is applied to the clock inputs of flip flops 76 and 82 and one shot timers 78 and 84. Likewise, signal POR is supplied to the reset inputs of flip flops 76 and 82 and one shot timers 78 and 84.

In operation, consider the top half of block diagram 68 which includes comparator circuit 74, flip flop 76 and one shot timer 78. Comparator circuit 74 outputs a logic low or a logic high signal depending upon whether the voltage appearing at terminal 64 is above or below floating ground. Flip flop 76 samples the output of comparator circuit 74 at each pulse and provides signal ZV_D at its output. Finally, one shot timer 78 provides predetermined-width pulses (on signal ZV) for each transition appearing at the output of flip flop 76.

Figure 4:
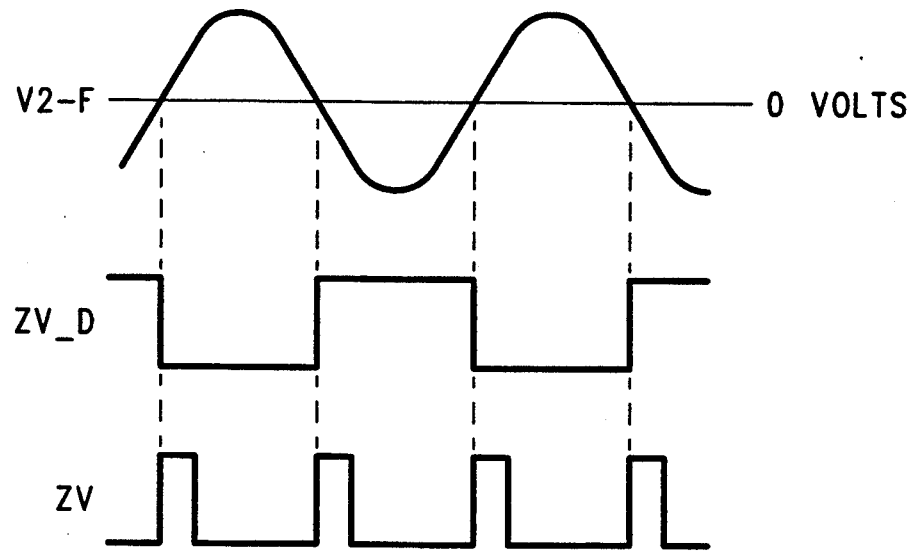
FIG. 4 is a pictorial diagram including waveforms for illustrating typical input and output signals of the zero crossing comparator block.

Referring to FIG. 4, a pictorial diagram for more clearly illustrating the operation of comparator circuit 74, flip flop circuit 76 and one shot timer 78 is shown. As can be seen, whenever V2—F is above zero volts, signal ZV_D is a logic low, while whenever signal V2—F is below ground, signal ZV_D is a logic high. Thus, if signal V2—F is a sine wave, signal ZV_D will be a square wave. Also, for every logic transition occurring on signal ZV_D, signal ZV is a logic high for a predetermined pulse width.

Likewise, it should be understood that signal ZC is a series of predetermined-width pulses occurring each time input signal V3—F crosses zero. Note that if V2—F was a DC signal rather than an AC signal as shown in FIG. 4, signal ZV_D would always be a logic high or a logic low depending upon whether V2—F was a positive or negative DC voltage (this assumes that we are neglecting noise). Thus, for a DC signal, signal ZV will not include any pulses.

Signals ZV and ZC are utilized in AC mode wherein it is desired to turn on switch 12 at a zero voltage (a pulse on signal ZV) for power supply 16, and to turn off switch 12 at a zero current (a pulse on signal ZC) for power supply 16.

In summary, zero crossing comparator block 68 provides signals ZC and ZV for respectively providing predetermined width pulses whenever signals V3—F and V2—F cross zero. In addition, zero crossing comparator block 68 provides signal ZV_D which is essentially a logic high whenever voltage signal V2—F is below ground and a logic low whenever voltage signal V2−F is above ground.

AC/DC discernment block 88 receives sense voltage V2−F and signals CLK, POR, ACCLK and ACTU, and provides output signal AC at terminal 90 wherein signal AC is a logic high when the signal appearing at terminal 64 is determined to be an AC signal and wherein signal AC is a logic low when the signal appearing at terminal 64 is determined to be a DC signal.

Figure 5:
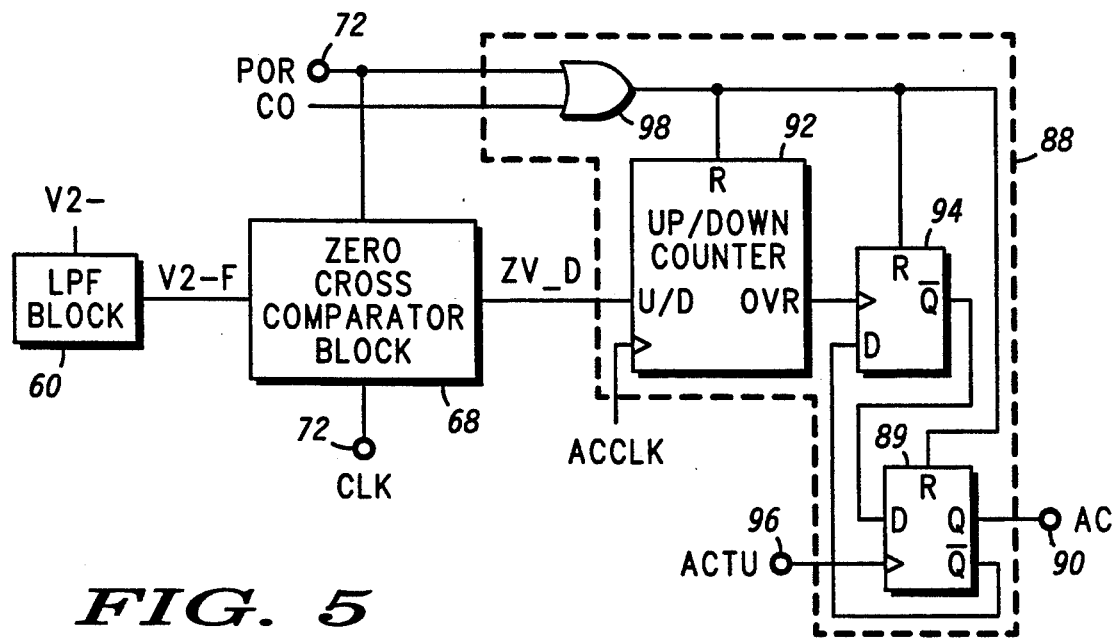
FIG. 5 is a block diagram illustrating an AC/DC discernment circuit as shown in FIG. 1 in accordance with the present invention.

Referring to FIG. 5, a pictorial diagram illustrating AC/DC discernment block 88 is shown along with low pass filter block 60 and zero crossing comparator block 68. It is understood that although AC/DC discernment block 88 does not explicitly include low pass filter block 60 and zero crossing comparator block 68, the actual implementation of AC/DC discernment is the full block diagram shown in FIG. 5. Further, is is understood that components shown in FIG. 5 which are identical to components shown in FIGS. 1 and 2 are identified by the same reference numbers.

AC/DC discernment block 88 includes up/down counter 92 having an up/down input coupled to receive signal ZV_D from zero crossing comparator block 68. Counter 92 has a clock input coupled to receive signal ACCLK which is an internal AC/DC discernment dock that is typically slower than the system clock (CLK). An overflow (OVR) output of up/down counter 92 is coupled to the dock input of flip flop 94. The data input of flip flop 94 is coupled to an inverting output of flip flop 89, while the an inverting output of flip flop 94 is coupled to the data input of flip flop 89. The clock input of flip flop 89 is latched by signal ACTU which appears at terminal 96 and will be described in detail later. Further, a noninverting output of flip flop 89 provides signal AC appearing at terminal 90. Additionally, OR gate 98 has first and second inputs respectively coupled to receive signals POR and CO, and an output coupled to the reset inputs of up/down counter 92 and flip flops 89 and 94. Signals POR and CO will be discussed in detail later but for now it will suffice to state that as long as both signals are a logic low, then up/down counter 92 and flip flops 89 and 94 will not be reset.

Upon power-up, control circuit 10 must be able to distinguish the type of power supply (AC or DC) that it is connected to. This is accomplished through the AC/DC discernment circuit shown FIG. 5. The AC/DC discernment circuit detects whether power supply 16 is AC or DC and latches up that detection by providing a logic high or logic low, respectively, at terminal 90.

Since control circuit 10 will operate in only one mode once a discernment is made, it is very important that a correct decision is made even in a noisy environment. In a noisy environment where the power line contains all the harmonic and sub-harmonic frequencies, a simple scheme of determining AC/DC mode by detecting zero crossings will typically not work well because it is likely that zero crossings on a noisy AC line may be missed, or some zero crossings on a noisy DC line may be detected. However, the AC/DC discernment circuit shown in FIG. 5 is designed to reduce the probability of making the wrong AC/DC determination by essentially averaging the number of samples that voltage signal V2− is above ground reference with the number of samples that voltage signal V2− is below ground reference.

In operation, when signal ZV_D is a logic high, each time up/down counter 92 is docked by signal ACCLK the counter will count up. On the other hand, when signal ZV_D is a logic low, than each time up/down counter 92 is docked by signal ACCLK the counter will count down. Therefore, if signal V2− is an AC signal, then signal ZV_D will essentially be a square wave as shown in FIG. 4 which will function to force counter 92 to count up for a period of time and then count down for a period of time. In the end result, if up/down counter 92 is initialized at a middle value and flip flops 94 and 95 are reset, an AC signal will not cause up/down count to reach an all zero or an all one count and the overflow output of up/down counter 92 will remain at a logic zero. Therefore, upon the clocking of flip flop 89 by signal ACTU, signal AC will be a logic one denoting that sense voltage V2− is an AC signal.

However, if V2− is a DC signal for example a positive DC signal, signal ZV_D will usually be a logic low thereby resulting in up/down counter 92 to count down for almost every time it is clocked. This will result in up/down counter 92 containing all zeros in its outputs which means that overflow output of counter 92 will be a logic one. Note that a similar result will occur if V2− was a negative DC signal wherein up/down counter 92 would count up to contain all ones at its outputs and still resulting in the overflow output being a logic one. In other words, OVR output of counter 92 will be a logic one whenever all outputs of counter 92 are at the same logic state. Hence, upon clocking flip flop 89 by signal ACTU, signal AC appearing at terminal 90 will be a logic low signifying that sense voltage V2− is a DC signal.

Figure 6:
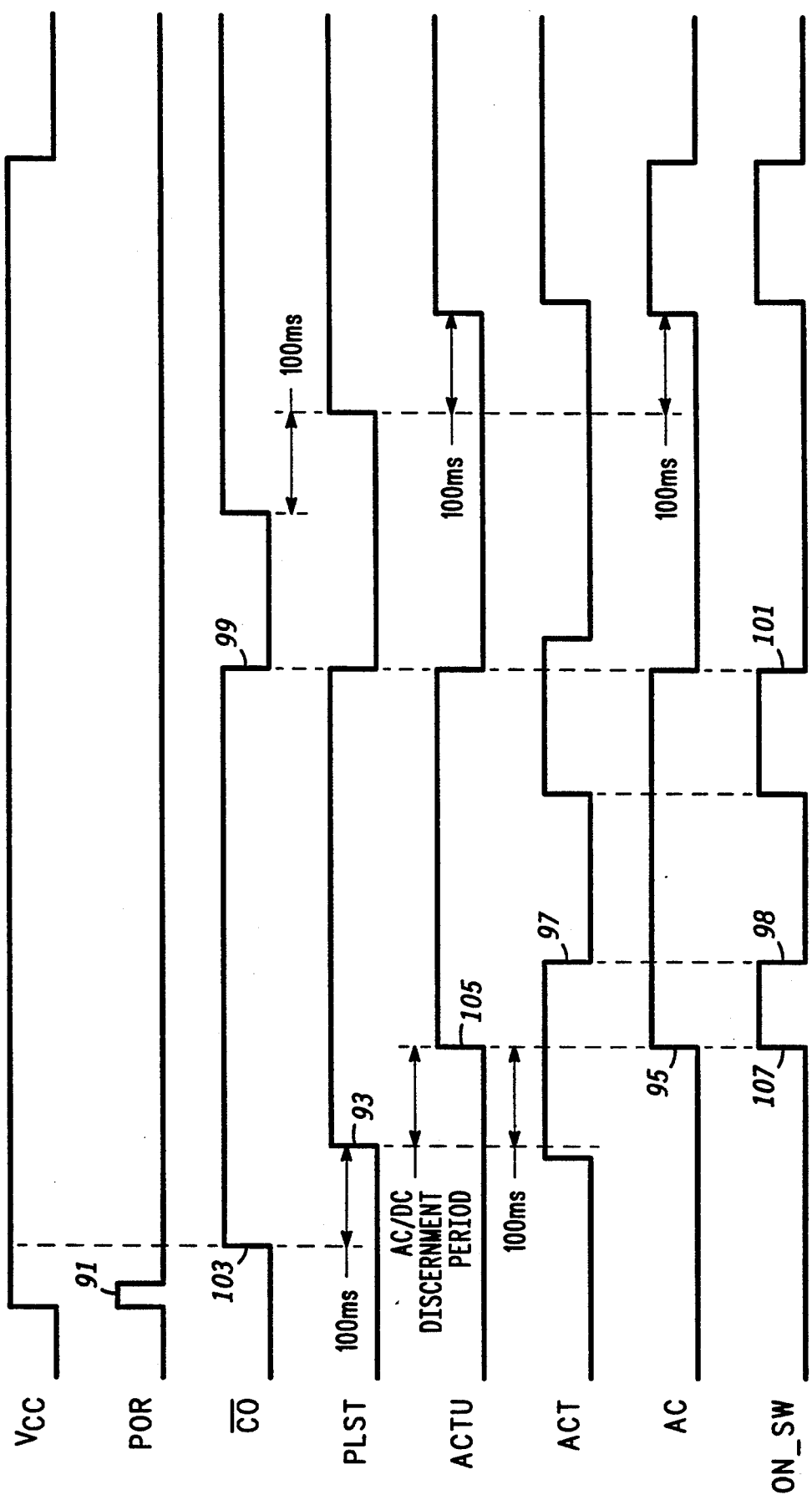
FIG. 6 is a pictorial diagram including waveforms for illustrating the operation of the AC/DC discernment circuit.

Referring to FIG. 6, a pictorial diagram illustrating the operation of the AC/DC discernment circuit is shown. Upon power up of voltage $V_{CC}$, power on reset pulse 91 (signal POR) will function to reset all latches and counters within control circuit 10. Signal CO is a Cold Open signal which is a logic one when switch 12 is off and when the magnitude of both sense voltages V2+F and V2−F have fallen below a predetermined threshold. Thus, when a power line is detected via sense voltages V2+ and V2−, cold open (CO) signal will go low indicating that the magnitude of both voltages V2+F and V2−F have exceeded a predetermined threshold. As a result, signal CO will transition from a logic low to a logic high as indicated by transition 103. 100 milliseconds after signal CO transitions from a logic low to a logic high voltage level, timing signal PLST transitions from a logic low to a logic high voltage level as indicated by transition 93 thereby signifying the start of the AC/DC discernment period. This wait time which is called the Power Line Settling Time (PLST) is to ensure that the power line will settle down after initially being connected to control circuit 10 wherein AC surges typically induce undesired noise.

Once signal PLST transitions from a logic low to a logic high, control circuit 10 goes into an AC/DC discernment state and within 100 milliseconds, control circuit 10 will latch up to either an AC or a DC mode. As previously described, a DC mode is set when the majority of a large number of samples indicates that the power line is either positive or negative within the 100 millisecond period. In other words, a sample taken at the positive swing of the AC signal is considered a positive sample and vise versa. Otherwise, the end of the 100 milliseconds coupled with a non-DC detection will force an AC determination mode as indicated by transition 95. The end of the AC/DC discernment period is signified when timing signal ACTU transitions from a logic low voltage level to a logic high voltage level as indicated by transition 105. It is between the 100 ms period from when signal PLST goes high to when signal ACTU goes high that control circuit 10 in operating in an AC/DC discernment mode.

However, in the case of a DC determination, output OVR of counter 92 will transition to logic high before the end of the AC/DC discernment period as indicated by transition 105 thereby signifying a determination that the power supply is a DC signal. Switch FET bridge 12 will not be rendered operative via signal ON_SW until after the 100 millisecond AC/DC discernment period. In other words, signal ON_SW will not transition until signal ACTU transitions from a logic low to a logic high state as illustrated by transition 107 being synchronous with transition 105. This assumes that signal ACT is already a logic high as shown wherein ACT is a signal originated from a micro processor which is a logic high to turn on switch 12 via signal ON_SW which enables MOSFETs 18 and 20.

The AC/DC determination will stay latched either in an AC or a DC mode for the rest of the operation as long as no interruption occurs. It should be understood that for AC mode, a slight delay may exist between transitions 97 and 98 because switch 12 will not be turned off until a zero current crossing occurs (the next pulse on signal ZC). However, during DC mode, no such delay exists.

An interruption is defined as the occurrence of one of three conditions:

1) the chip power voltage $V_{CC}$ gets interrupted;
2) a cold open load condition is detected during OFF state when either voltage V2+ or V2− falls below a predetermined threshold: or
3) a hot open load condition is detected during the ON state of FET switch 12 when the current through switch 12 falls below a predetermined level.

As an example shown in FIG. 6, when voltage signal CO falls to a logic low level as shown by transition 99, signal ON_SW is immediately switched to a logic low voltage level as shown by transition 101 and the process begins all over again.

In summary, signal AC appearing at terminal 90 will represent a determination of whether power supply 16 is an AC or a DC signal wherein if a logic high appears at a terminal 90, then an AC signal has been determined, while if a logic low appears at terminal 90, then a DC signal has been determined.

Terminal 90 is coupled to voltage reference block 100, timer circuit 102 and synchronous state machine 104. Voltage reference block 100 provides voltage reference signals $V_{ALARM2}$ and $V_{TRIP3}$ wherein each voltage will be one of two distinct voltages depending upon the logic state of signal AC.

Figure 7:
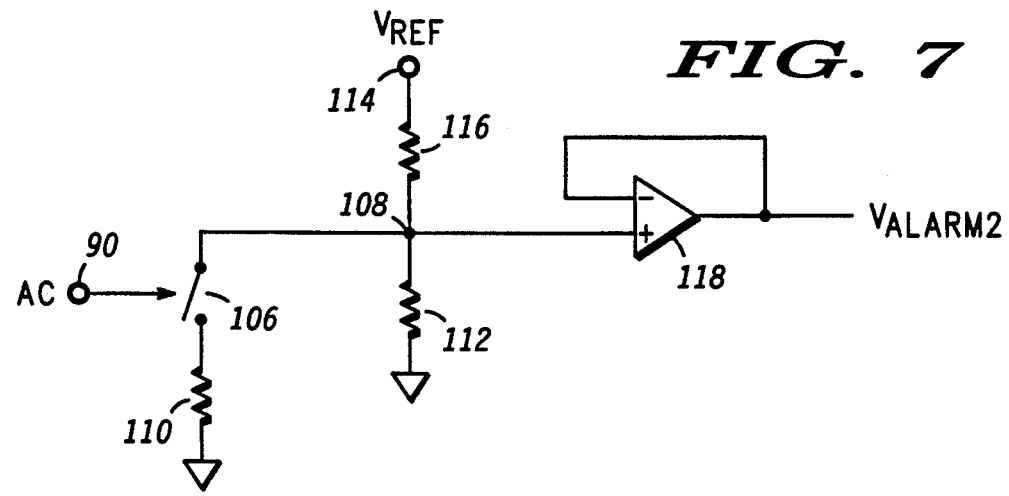
FIG. 7 is a detailed schematic diagram illustrating one implementation of a voltage reference circuit for use in the voltage reference block shown in FIG. 1.

Referring to FIG. 7, a detailed schematic diagram illustrating at least one implementation of a reference circuit utilized to generate voltage $V_{ALARM2}$ is shown. The circuit shown in FIG. 7 includes switch 106 having a control terminal coupled to terminal 90, a first terminal coupled to circuit node 108, and a second terminal coupled through resistor 110 and returned to ground reference. Circuit node 108 is returned to ground reference via resistor 112 and coupled to terminal 114 via resistor 116 wherein a reference voltage $V_{REF}$ is supplied to terminal 114. Circuit node 108 is coupled to the non-inverting input of buffer amplifier 118 while the output of buffer amplifier 118 provides voltage signal $V_{ALARM2}$. Also, the inverting input of buffer 118 is coupled to the output of buffer 118.

Briefly, if signal AC is a logic high, switch 106 is open and voltage $V_{ALARM2}$ is substantially equal to $[V_{REF} \times (R112/(R116+R112))]$. However, if signal AC is a logic low switch 106 is closed and resistor 110 is now placed in parallel with resistor 112 thereby decreasing the resistance seen between circuit node 108 to ground reference. This will have the net effect of decreasing the reference voltage $V_{ALARM2}$ signal AC is a logic low.

In summary, voltage $V_{ALARM2}$ is a first predetermined voltage when signal AC is a logic high, and a second predetermined voltage when signal AC is a logic low. Further, the first predetermined voltage is typically larger than the second predetermined voltage because higher peak current thresholds are allowed for an AC signal having the same root mean square (rms) value as a similar DC rms valued signal.

It is understood that a similar circuit exists for generating voltage $V_{TRIP3}$ wherein the values of resistors corresponding to resistors 110, 112 and 116 of FIG. 7 may be chosen to provide a different reference voltage.

Timer circuit 102 is coupled to terminals 90 and 26 for receiving signals AC and ON for generating output signal GT (grace time) which is a predetermined pulse-width signal of either 25 milliseconds or 75 milliseconds depending upon the logic state of signal AC. It is worth noting that the rising edge of signal GT corresponds with the rising edge of signal ON_SW. Signal GT is a grace time that will be utilized to mask the effects of current surges due to switch 12 being turned on.

Figure 8:
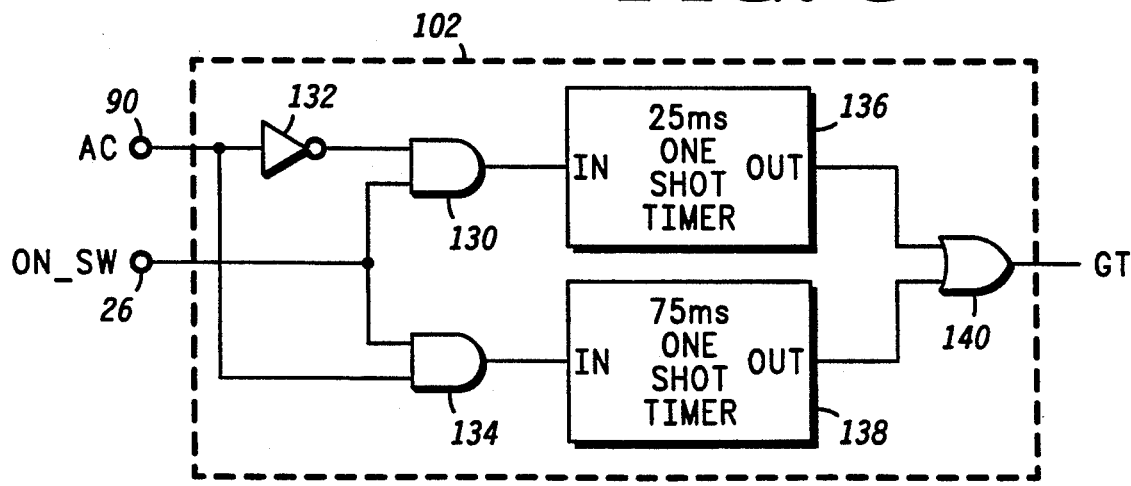
FIG. 8 is a block diagram illustrating at least one implementation of the timer circuit shown in FIG. 1.

In particular, referring to FIG. 8, there is illustrated a detailed block diagram of at least one implementation of timer circuit 102. The circuit in FIG. 8 includes AND gate 130 having a first input coupled to the output of inverter 132 wherein the input of inverter 132 is coupled to terminal 90. The second input of AND gate 130 is coupled to terminal 26. AND gate 134 has a first input coupled to terminal 26, and a second input coupled to terminal 90. The outputs of AND gates 130 and 134 are respectively coupled to the inputs of one shot timers 136 and 138. Further, the outputs of one shot timers 136 and 138 are respectively coupled to the first and second inputs of OR gate 140, the later having an output for providing signal GT.

Briefly, assuming that signal ON_SW is a logic high, if signal AC is a logic high, the output of AND gate 130 is a logic low while the output of AND gate 134 is a logic high. This will result in a 75 millisecond one shot pulse being provided at the output of one shot timer 138 which is correspondingly past through OR gate 140 and provided on signal GT. On the other hand, assuming that signal ON_SW is a logic high, if signal AC is a logic low, then the output of AND gate 130 is a logic high while the output of AND gate 134 is a logic low. This will force one shot timer 136 provide a 25 millisecond pulse at its output which will be subsequently past through OR gate 140 and provided on signal GT.

In summary, provided that signal ON_SW is a logic high, signal GT will either be a 25 millisecond pulse via timer 136, or a 75 millisecond pulse via timer 138 depending upon the logic state of signal AC.

Load current comparator block 150 receives input signals GT, $V_{ALARM2}$, $V_{TRIP3}$, $V_{TRIP4}$ and filtered voltages V1+F, V1−F, V3+F and V3−F for providing output signals TRIP4, TRIP3 and ALARM2.

Referring to FIG. 9, the detailed block diagram illustrating at least one implementation for generating signal TRIP3 is shown. The circuit of FIG. 9 includes comparator circuits 152 and 153 each having a non-inverting input coupled to receive voltage $V_{TRIP3}$ from voltage reference block 100. The inverting input of comparator 152 is coupled to terminal 61, while the inverting input of comparator 153 is coupled to terminal 62. The outputs of comparators 152 and 153 are respectively coupled to first and second inputs of NAND gate 154 the output of which is coupled to the first input of AND gate 155. The second input of AND gate 155 is coupled to receive the inversion of signal GT. The output of AND gate 155 is coupled to the input of D-flip flop 156 the output of which supplies logic signal TRIP3. Flip flop 156 has a clock input coupled to terminal 70 for receiving the system clock.

In operation, signal TRIP3 is a logic high when the magnitude of voltage V1+F or voltage V1−F (which senses the load current) rises above the threshold voltage level of $V_{TRIP3}$ whereby if signal TRIP3 is a logic high, it is desired to shut down FET switch 12 upon the next pulse of signal ZC for an AC load, and to instantly shut off FET switch 12 for a DC load. Thus, signal TRIP3 does depend upon whether control circuit 10 is operating in an AC or DC mode because a voltage level of $V_{TRIP3}$ is dependent upon the logic state of signal AC.

It should be understood that the generation of logic signal ALARM2 can be accomplished in a similar manner as shown in FIG. 9 for generating logic signal TRIP3 wherein $V_{ALARM2}$ would replace $V_{TRIP3}$ as shown in FIG. 9. Further, $V_{ALARM2}$ is designed to be less than $V_{TRIP3}$ wherein signal ALARM2 is a logic high when the magnitude of voltage V1+F or voltage V1−F (which senses the load current) rises above the threshold voltage level of $V_{ALARM2}$ such that if signal ALARM2 is a logic high, an overcurrent condition is detected but not sufficient to warrant turning off FET switch 12. In summary, logic signals TRIP3 and ALARM2 are a logic high whenever an overcurrent condition exists at the load. Signal ALARM2 being in a logic high state indicates that the load current has exceeded a first predetermined threshold but FET switch 12 is not turned off. Signal TRIP3 being in a logic high state indicates that the load current has exceeded a second predetermined threshold, and the overcurrent condition is sufficient enough to warrant the turning off of FET switch 12 either immediately (for a DC load), or upon the next zero-crossing (for an AC load).

Referring to FIG. 10, a more detailed block diagram illustrating at least one implementation for generating signal trip TRIP4 is shown. The circuit of FIG. 10 includes comparators 160 and 161 each having a noninverting input coupled to receive the reference voltage $V_{TRIP4}$. The inverting input of comparator 160 is coupled to terminal 61 while the inverting input of comparator 161 is coupled to terminal 62. The outputs of comparators 160 and 161 are respectively coupled to first and second inputs of NAND gate 162. The output of NAND gate 162 provides signal TRIP4 to an input of synchronous state machine 104.

Briefly, TRIP4 is an asynchronous signal that transitions from a logic low to a logic high state whenever the magnitude of either voltages V1+F or V1−F exceeds reference voltage $V_{TRIP4}$. Thus, whenever the load current exceeds voltage $V_{TRIP4}$, signal TRIP4 is a logic high. Further, by design voltage $V_{TRIP4} > V_{TRIP3} > V_{ALARM2}$ and when signal TRIP4 becomes a logic high, an extreme overcurrent load condition exist and it is desired to shut off FET switch 12 immediately regardless of whether the load is DC or AC.

In summary, signals ALARM2, TRIP3 and TRIP4 are logic signals which are a logic high when the load current (as sensed via filtered sense voltages V1+F and V1−F) exceeds predetermined thresholds.

Open load detector block 170 has a plurality of inputs for receiving voltages V2+F, V2−F, V3+F and V3−F along with reference voltages $V_{CO}$ and $V_{HO}$ in order to provide logic signals HO (hot open) and CO (cold open) to synchronous state machine 104. Signal HO is a logic signal that indicates a hot open load condition, during the on-time of switch 12, when the current through the switch falls below a predetermined threshold. Likewise, signal CO is a logic signal that indicates a cold open load condition, during the off-time of switch 12, when sense voltages V2+F and V2−F both fall below a predetermined threshold.

In particular, referring to FIG. 11, there is illustrated a more detailed block diagram of at least one implementation for generating logic signal CO for open load detector block 170. The detector circuit shown in FIG. 11 includes comparators 171 and 172 each of which have a non-inverting input coupled to receive a reference voltage $V_{CO}$. The inverting input of comparator 171 is coupled to terminal 63 while the inverting input comparator 172 is coupled to terminal 64. The outputs of comparators 171 and 172 are respectively coupled to first and second inputs of NAND gate 173. The output of NAND gate 173 is coupled to the data input of flip flop 174 the latter having a output coupled to the reset input of counter 175 and to the reset input of RS latch 176. The set input of flip flop 174 is coupled to terminal 26 while the clock input of the same is coupled to terminal 70 to receive the system clock (CLK). Counter 175 has an output coupled to a first input of OR gate 177 the later having a second input coupled to terminal 72 for receiving signal POR. The clock input of counter 175 is coupled to terminal 70. The output of OR gate 177 is coupled to the set input of RS latch 176.

Briefly, in order for logic signal CO be a logic high, the magnitude of sense voltages V2+F and V2−F must be less than the reference voltage $V_{CO}$ for a predetermined length of time which is determined by counter 175. Signal CO is a logic signal for detecting when the AC or DC load signal disappears during the off time of FET switch 12. Thus, when the currents through resistors 44, 48, 54 and 50 fall below a certain value for a predetermined length of time during the OFF state of FET switch 12 (signal ON_SW being a logic low), both sense voltages V2+F and V2−F fall below voltage $V_{CO}$ and signal CO becomes a logic high. The predetermined length of time via counter 175 is necessary in order to account for the zero crossing time of an AC load because during the zero crossing time of an AC signal, V2+F and V2−F both fall below voltage $V_{CO}$. Thus, counter 175 is clocked a predetermined number of times to prevent a false Cold Open load indication due to the AC signal crossing zero.

Note however that if signal ON_SW goes to a logic high, flip flop 174 is set thereby providing a logic one at the reset input of RS latch 176 thereby forcing logic signal CO to a logic low state. Thus, logic signal CO is inactive when FET switch 12 is on.

It should be understood that a similar circuit exists for the generation of signal HO wherein voltage $V_{CO}$ is replaced by reference voltage $V_{HO}$ and the set input of flip flop 174 is returned to ground instead of coupled to receive signal ON_SW. In addition, filtered voltages V2+F and V2−F are respectively replaced by filtered voltages V3+F and V3−F. Signal HO is a logic signal for detecting when the AC or DC load signal falls below a predetermined threshold during the on time of FET switch 12. Thus, when the currents through resistors 24 and 30 fall below a certain value for a predetermined length of tinge during the on state of FET switch 12, both sense voltages V3+F and V3−F fall below voltage $V_{HO}$ and signal HO becomes a logic high.

In summary, signals CO and HO are logic highs when a cold open load condition or a hot open load condition are detected, respectively.

Synchronous state machine 104 has a plurality of inputs for receiving signals ALARM 2, TRIP 3, TRIP 4, ZC, ZV, HO, CO, system clock CLK, signal POR, and signal ACTU. In addition, synchronous state machine 104 also receives signals OBT (Output Blanking Time), signal PLST and signal ACT.

Referring to FIGS. 12 and 13, a state machine flow chart for synchronous state machine 104 is shown. The eight different states of synchronous state machine 104 are PL, ACDC, NOFF, OFF, ON, ALARM, OPEN, and TRIP, which are respectively represented by blocks 181-188. It should be realized that synchronous state machine 104 is capable of being in only one of the eight states wherein signal ON_SW is a logic high when state machine 104 is in the ON state. Although a detailed explanation of each one of the eight states will not be discussed, it is worth discussing a brief description of each state.

Figure 12A:
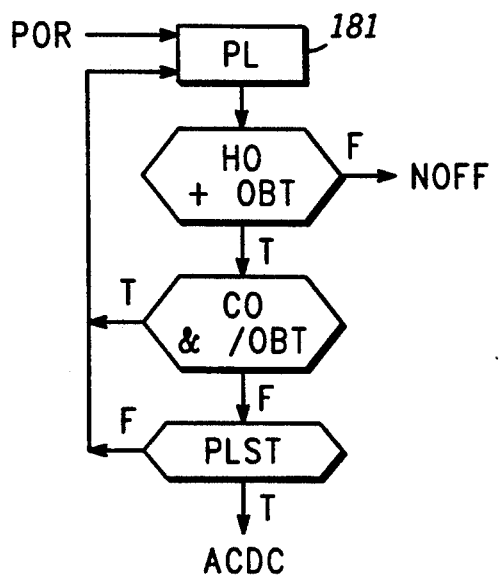
FIGS. 12A-12D and 13A-13D comprise a state machine flow chart for describing the states of the synchronous state machine shown in FIG. 1.
Figure 12B:
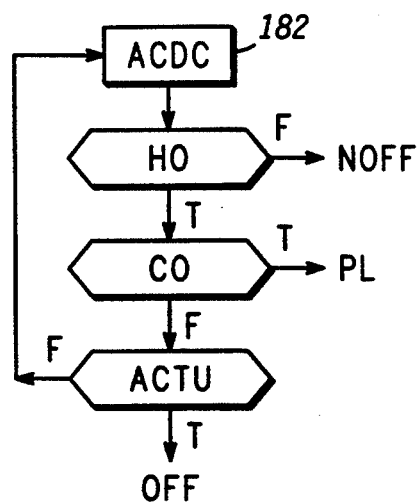
Figure 12C:
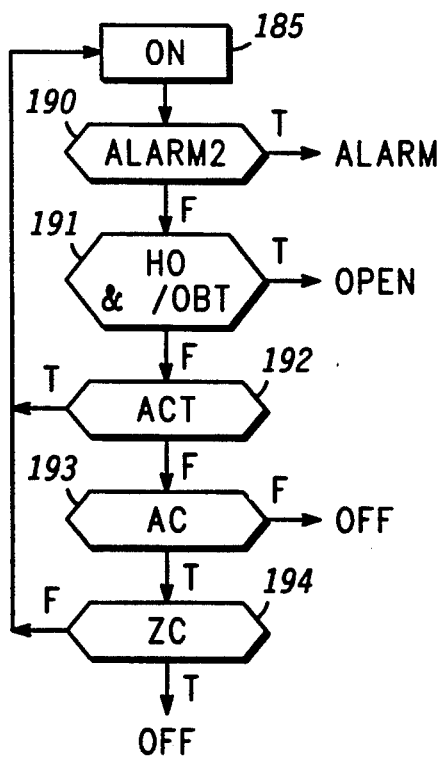
Figure 12D:
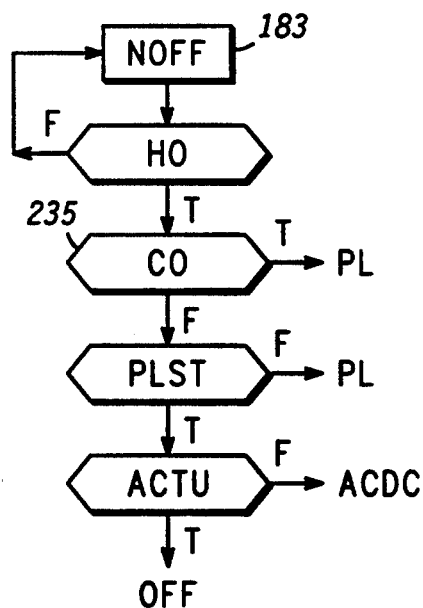
Figure 13A:
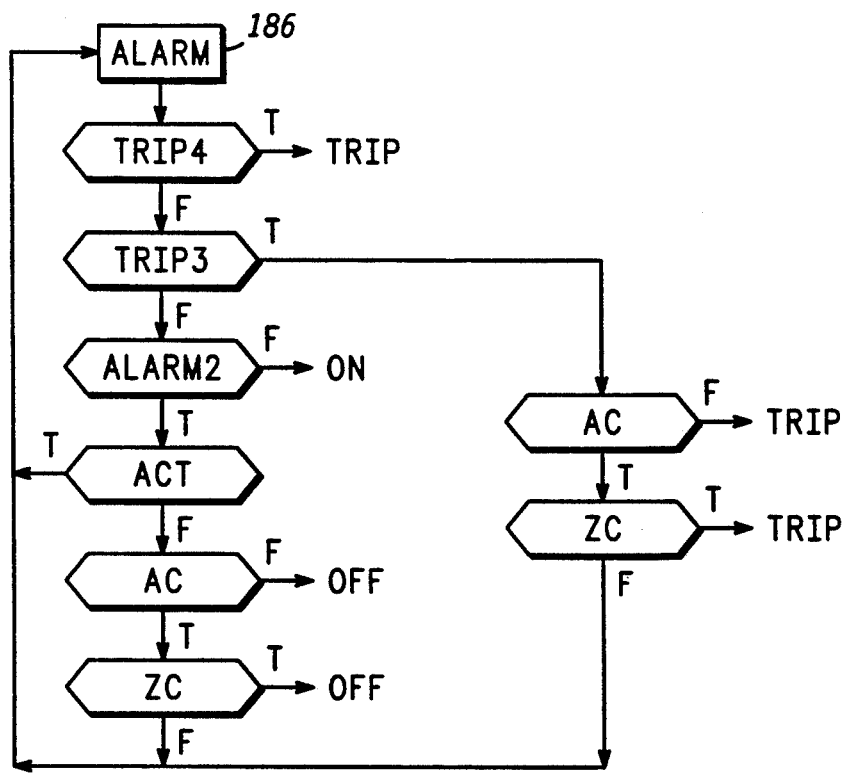
Figure 13B:
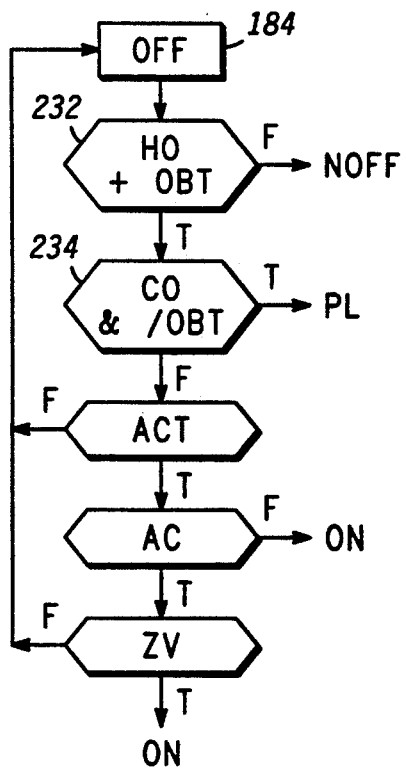
Figure 13C:
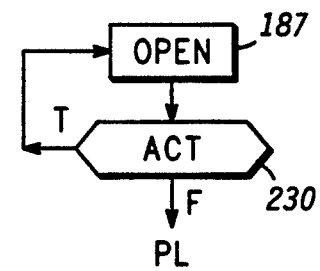
Figure 13D:
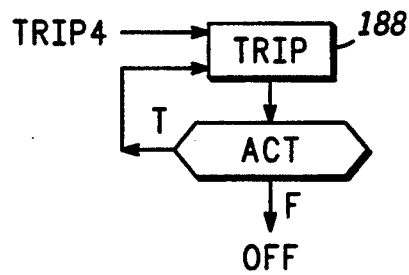

State PL of FIG. 12A represents a power line ready and indicates that a cold open condition (signal CO being a logic high) is present. Control circuit 10 is waiting for the confirmation of an AC or DC discernment. State ACDC of FIG. 12B means that control circuit 10 is in an AC/DC discernment state wherein control circuit 10 has confirmed the presence of an AC or DC power source and is attempting to distinguish which type of power source. State OFF of FIG. 13B represents when switch 12 is in the off condition. In this state, no load current except maybe leakage current is passing through transistors 18 and 20. The NOFF state of FIG. 12D means that the switch is being switched off, but a sufficiently high predetermined leakage current is detected through transistors 18 and 20. The ON state of FIG. 12C means that switch 12 is turned on and the load current flowing through switch 12 is within predetermined specified requirements. The ALARM state of FIG. 13A means that the switch is turned on, but the load current through switch 12 is above a predetermined current limit but below a second predetermined current limit. In other words, the magnitude of sense voltages V1+F or V1−F is above the threshold voltage $V_{ALARM2}$ but below $V_{TRIP3}$. The OPEN state of FIG. 13C signifies that a hot open condition (signal HO being a logic one) is present wherein control circuit 10 has detected a load current that is below an OPEN load limit when switch 12 is on. Finally, the TRIP state of FIG. 13D means that switch 12 has been turned OFF during an ON state. This means that the load current has exceeded a predetermined limit which causes switch 12 to shut off immediately. In other words, the magnitude of sense voltages V1+F or V1−F is above the threshold voltage $V_{TRIP3}$ or above threshold voltage $V_{TRIP4}$.

As an example of the operation of one of the states for synchronous state machine 104, a discussion of the procedure when synchronous state machine is in the ON state as indicated in block 185 will be presented. While in the ON state, if signal ALARM 2 is a logic high, the state of synchronous state machine 104 will transition from the ON state to the ALARM state as illustrated by block 190. Further, if signal HO is a logic high and signal OBT is a logic low, then the synchronous state machine 104 will switch from an ON state to an OPEN state as illustrated by block 191. If signal ACT is a logic high, then the control circuit 10 will continue monitoring the logic levels of signals ALARM2, HO and OBT as illustrated by block 192. However, if signal ACT is a logic low and signal AC is a logic high and signal ZC is a logic high, synchronous state machine 104 will switch from an ON state to an OFF state as illustrated by blocks 192, 193 and 194.

Referring back to FIG. 1, signals S0 and S1 are provided by synchronous state machine 104 (back to the microprocessor that provided signal ACT) wherein signals S0 and S1 provide information to the microprocessor about the operation of switch 12. The eight states of synchronous state machine 104 are identified by the logic states of signals ACT, S0 and S1 as shown in the following table.

TABLE 1

Logic states of signals ACT, S0 and S1 for the eight states of synchronous state machine 104.

| STATE VARIABLE | ACT | S0 | S1 |
|---|---|---|---|
| PL | 0 | 1 | 0 |
| ACDC | 0 | 0 | 1 |
| OFF | 0 | 1 | 1 |
| NOFF | 0 | 0 | 0 |
| ON | 1 | 0 | 1 |
| ALARM | 1 | 0 | 0 |
| TRIP | 1 | 1 | 0 |
| OPEN | 1 | 1 | 1 |

Figure 14:
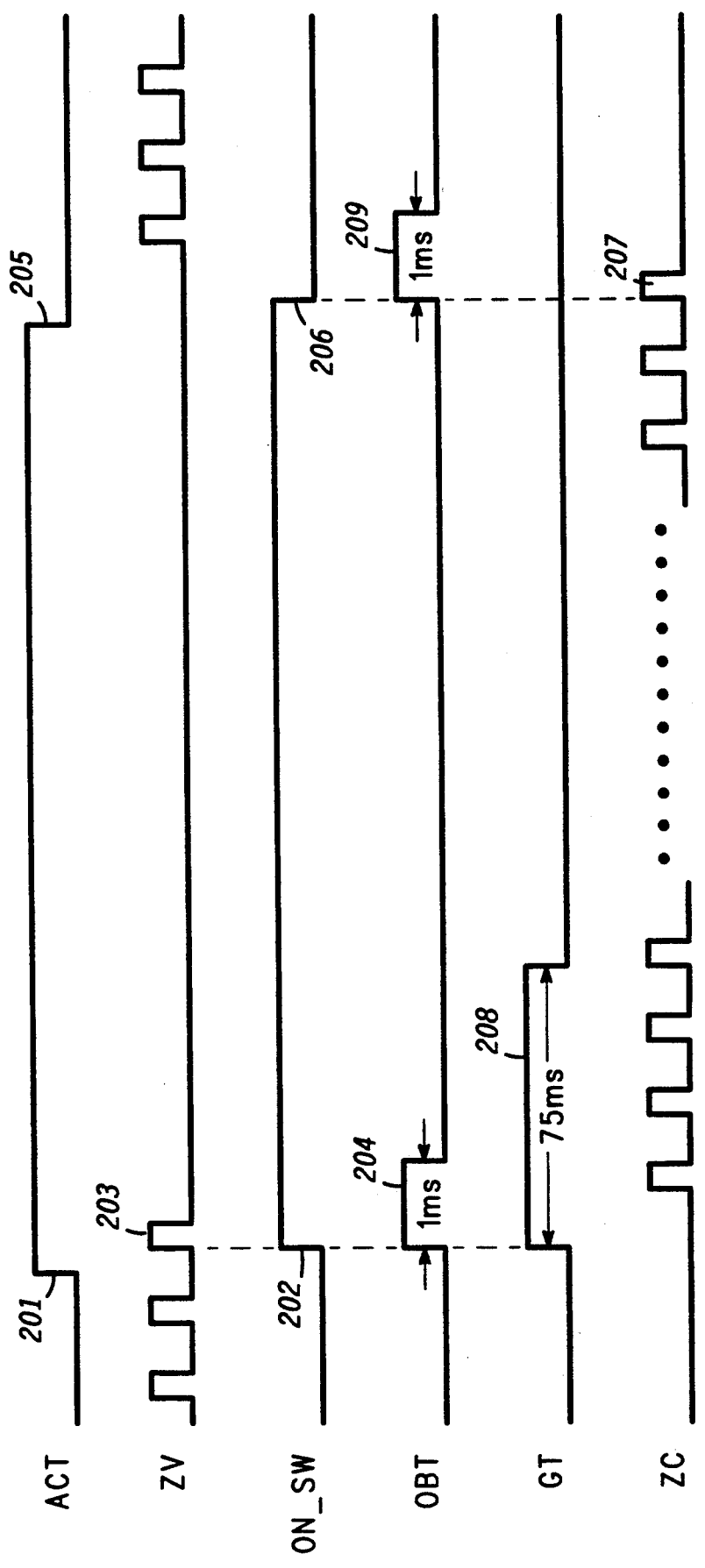
FIG. 14 is a graphical diagram including waveforms for illustrating the operation of the control circuit after an AC determination has been made.

Referring to FIG. 14, there is illustrated a graphical diagram to illustrate the AC operation of control circuit 10. In particular, when signal ACT switches from a logic low state a logic high state as shown by logic transition 201, signal ON_SW will transition from a logic low state to a logic high state as shown by logic transition 202, but not until a pulse occurs on signal ZV as illustrated by pulse 203. This ensures that we are switching FET switch 12 on when the load current is crossing zero. After signal ON_SW goes high, timing signal OBT will go high for period of one millisecond (as illustrated by pulse 204) to ensure a smooth transition from the OFF state to the ON state without producing glitches. This output blanking time pulse is necessary because immediately after each switching transitions of switch 12, it takes time for the voltages at V3+F and V3−F to be charged (or discharged) before they settle.

Further, at the rising edge of signal ON_SW, signal GT will go high for a period of 75 milliseconds (as illustrated by pulse 208) because we are in the AC mode. This grace time allows for surge currents which may occur at the load and which could cause erroneous states of logic signals TRIP3, TRIP4 and ALARM2. Upon synchronous state machine 104 entering the OFF state or when signal ACT goes low as shown by logic transition 205, signal ON_SW will transition from a logic high state to a logic low state as shown by logic transition 206, but not until the next pulse occurring on signal ZC as shown by pulse 207. Again, this is to ensure that switch 12 is not being switched when there is any appreciable current flowing through the load. In addition, signal OBT will go high for a period of 1 millisecond to allow for a smooth transition as illustrated by pulse 209.

Figure 15:
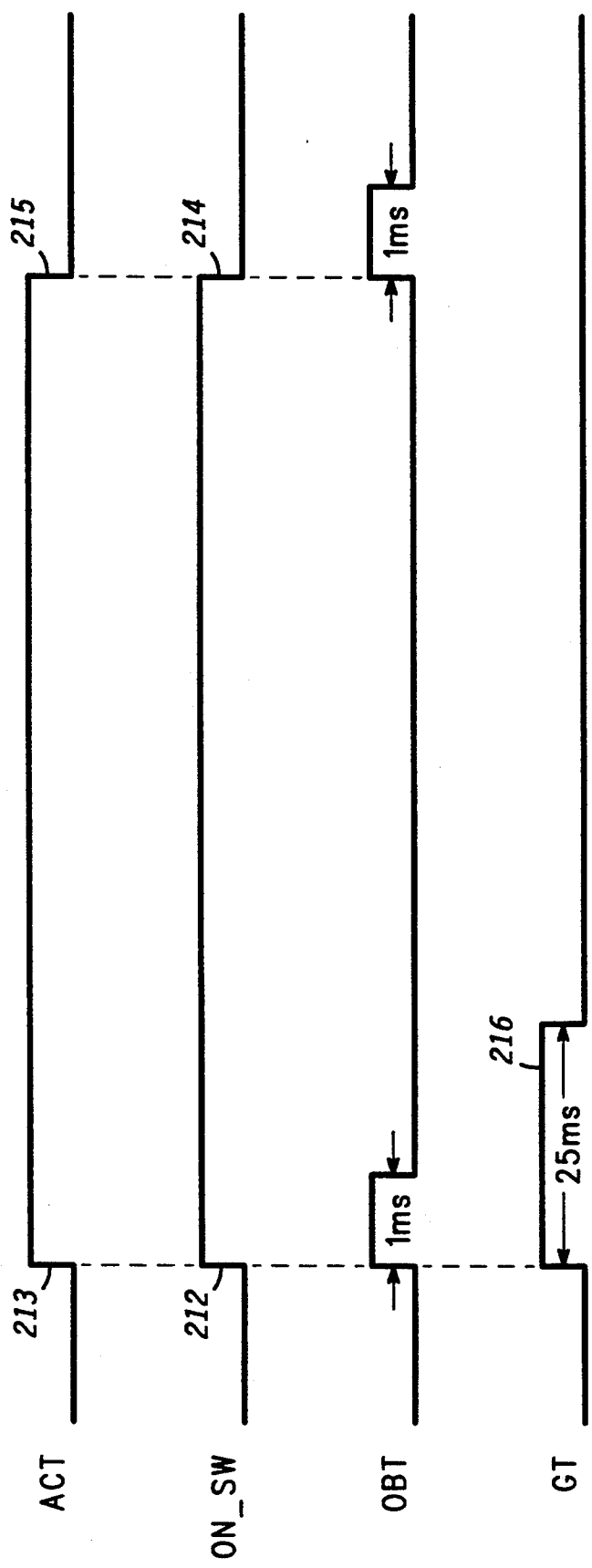
FIG. 15 is a graphical diagram including waveforms for illustrating the operation of the control circuit after a DC determination has been made.

Referring to FIG. 15, there is illustrated a graphical diagram to illustrate the AC operation of control circuit 10. The DC operation of control circuit 10 is similar to the AC operation with a few exceptions. In the DC mode, signal ON_SW will follow signal ACT such there is no delay time in waiting for the next zero crossing pulse. This is illustrated in FIG. 15 by transition 212 following transition 213, and transition 214 following transition 215. The other exception is that signal GT is only a 25 millisecond pulse as illustrated by pulse 216, rather than a 75 millisecond pulse.

In general, during the ON state, a hot open load condition (signal HO being high) will cause control circuit 10 which to send the circuit into an OPEN state as illustrated by block 191 of FIG. 12. In the OPEN state, signal ON_SW (which distinct from state ON) will be a logic low and switch 12 will be off. Any reconnection of the load (signal ACT being high) will not cause switch 12 to be turned on as illustrated by block 230 of FIG. 12. The OPEN state can only be exited to the PL state when signal ACT is a logic low thereby allowing a new AC/DC discernment to be made.

During the OFF state, control circuit 10 will constantly look for signal HO being a logic low. If this occurs, state machine will exit the OFF state and enter the NOFF state as illustrated by block 232. However, if a cold open condition is detected (signal CO being a logic high) in either the OFF state or the NOFF state, the state machine will exit that state and enter the PL state as illustrated by blocks 234 and 235 of FIG. 12. This will cause control circuit 10 to restart the procedures for power line setup and AC/DC discernment as aforedescribed for FIG. 6.

Figure 16:
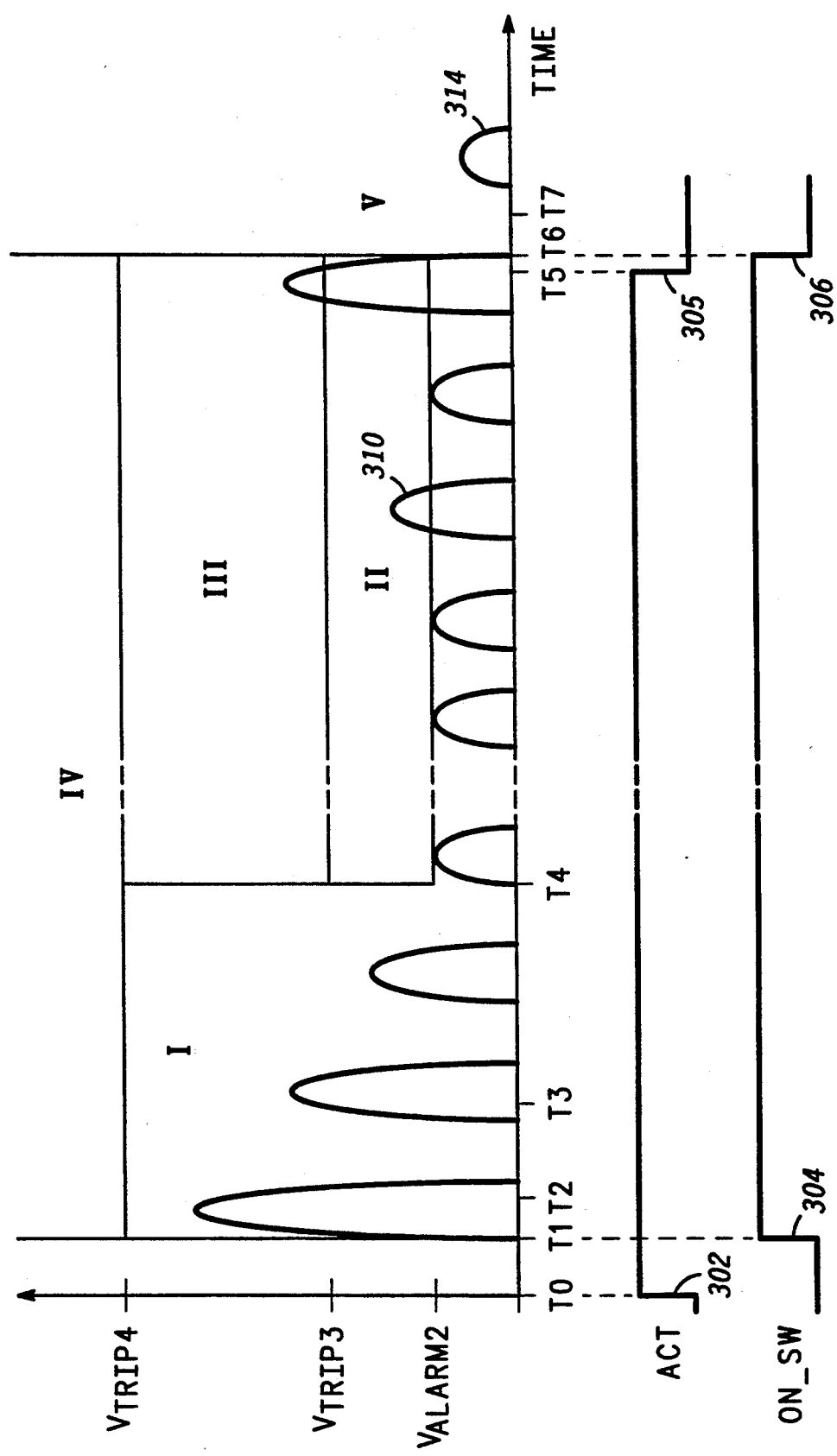
FIG. 16 is a pictorial diagram for illustrating the concept of the control circuit.

Referring to FIG. 16, a pictorial diagram for illustrating the overall concept of control circuit 10 in controlling FET switch 12 after an AC load already has been discerned is shown. The horizontal axis represents time while the vertical axis represents voltage. At time T0, microprocessor signal ACT transitions from a logic low to a logic high as indicated by transition 302. Frown time interval T0 to T1, control circuit 10 is waiting for the next zero voltage crossing before signal ON_SW is allowed to transition from a logic low to a logic high thereby turning on FET switch 12 (because an AC discernment has been made). Thus at time T1, signal ON_SW goes high, as indicated by transition 304, to turn on switch 12. From time interval T1 to T2, signal OBT is a logic high to ensure a smooth transition from switching switch 12 from off to on.

The grace period, which is 75 milliseconds for AC operation, is represented by time interval T1–T4. After the grace period, region I, known as the ALLOWABLE operation region, is where switch 12 is turned on at zero voltage (the next occurrence of a pulse on signal ZV) and turned off at zero current (the next occurrence of a pulse on signal ZC). Once we pass time T4, signals OBT and GT are all at a logic low and control circuit 10 will now respond to signals TRIP4, TRIP3 and ALARM2 if any overcurrent conditions exist.

Region II is known as the ALARM region wherein if the AC load signal rises above $V_{ALARM2}$, but not above voltage $V_{TRIP3}$, signal ALARM 2 will be in a logic high state thereby signifying that the load current through the power transistors is above an overcurrent limit but still below a trip limit. Thus, peak 310 of the AC load signal as shown in FIG. 16 would cause signal ALARM2 to be in a logic high state. Note, however, that the switch is not turned off.

In a similar manner, region III is known as a TRIP region wherein if the AC load signal exceeds voltage threshold $V_{TRIP3}$, as shown by portion 312 this will cause signal TRIP3 to be in a logic high state. Signal ACT will transition to a a logic low for example at time T5 as shown by transition 305, and switch 12 will be turned off at the next zero current as denoted at time T6 and illustrated by transition 306. Note that if this were for DC operation, switch 12 would be turned off immediately when the DC load exceeded voltage $V_{TRIP3}$.

Also, region IV is also known as a TRIP region wherein if at any time the AC signal surges above voltage threshold $V_{TRIP4}$, switch 12 will be immediately turned off regardless of whether there was an AC or DC determination.

Time interval T6 to T7 again represents a 1 millisecond output blanking tinge wherein signal OBT will be a logic high. Region 5 represents a not off region if FET switch 12 is turned off via signal ON_SW, but a pulse such as pulse 314 exists.

By now it should be apparent from the foregoing discussion that a novel control circuit for switching AC or DC loads and for automatically discerning the presence of an AC or a DC power supply via a switch has been provided. The control circuit is coupled to alternately render a switch operative and non-operative wherein the switch is coupled across a load which is powered up by either an AC or a DC power supply.

The control circuit includes an AC/DC discernment circuit for ascertaining whether the load is powered up by an AC or a DC power supply. The AC/DC discernment circuit samples the power line signal such that if a predetermined number of positive samples (or negative samples) are obtained within a fixed period of time, then a DC discernment is made, else an AC discernment is made.

The control circuit also includes circuitry for comparing signals sensed by the switch with predetermined thresholds (which are a function of whether an AC or DC determination has been made) for providing logic signals to control the operation of the switch.

While the invention has been described in conjunction with specific embodiments thereof, it is evident that many alterations, modifications, and variations will be apparent to those skilled in the art in the light of the forgoing description. Accordingly, it is intended to embrace all such alterations, modifications, and variations in the appended claims.

We claim:

1. A control circuit for alternately rendering a switch operative and non-operative, the switch being coupled to a load and a power supply, the switch providing a plurality of sense voltages in response to the signal level of the power supply, the control circuit comprising:

an AC/DC discernment circuit being responsive to one of the plurality of sense voltages of the switch for providing an output signal indicative of whether the power supply is providing an AC or DC signal; and means responsive to said output signal of said AC/DC discernment circuit for providing a control signal to the switch for alternately rendering the switch operative and non-operative.

2. A control circuit for alternately rendering a switch operative and non-operative, the switch being coupled to a load and a power supply, the switch providing a plurality of voltages in response to the signal level of the power supply, the control circuit comprising:

an AC/DC discernment circuit being responsive to one of plurality of voltages of the switch and to a plurality of clock and timing signals for providing an output signal indicative of whether the power supply is AC or DC, said AC/DC discernment circuit including:

a low pass filter having an input and an output, said input of said low pass filter being coupled to receive said one of said plurality of voltages of the switch;

a zero crossing comparator circuit having an input and an output, said input of said zero crossing comparator circuit being coupled to said output of said low pass filter, said output of said zero crossing comparator circuit providing a first signal, said first signal being in a first logic state when said one of said plurality of voltages of the switch is greater than a predetermined voltage, said first signal being in a second logic state when said one of said plurality of voltages of the switch is less than said predetermined voltage;

an up/down counter having an input and overflow output for sampling said first signal, said input of said up/down counter being coupled to said output of said zero crossing comparator circuit, said overflow output of said up/down counter being in a first logic state when said up/down counter has reached an all zero or all one count; and latching means having an input and an output, said input being responsive to said overflow output of said up/down counter, and said output of said latching circuit providing said output signal of said AC/DC discernment circuit;

the control circuit further including:

a voltage reference block having an input and first and second outputs, said input being responsive to said output signal of said AC/DC discernment circuit, said first and second outputs of said voltage reference block providing first and second reference voltages which are a function of whether an AC or a DC discernment has been made;

load current comparator block having a plurality of inputs responsive to a first portion of said plurality of said voltages of the switch and to said first and second reference voltages of said voltage reference block for providing a plurality of output logic signals;

open load detector means having a plurality of inputs responsive to a second portion of said plurality of voltages of the switch for providing output logic signals indicative of when said second portion of said plurality of voltages of the switch have fallen below predetermined thresholds; and a synchronous state machine having a plurality of inputs and having a state for providing an output signal to the switch to alternately render the switch operative and non-operative, said plurality of said inputs of said synchronous state machine being responsive to said output logic signals of said load current comparator block and of said open load detector means, and to a plurality of control signals.

3. The control circuit according to claim 2 wherein said zero crossing comparator circuit further includes means for detecting when the signal level provided by the power supply has crossed a zero threshold, said zero crossing comparator circuit providing a second and a third signal to said synchronous state machine.

4. The control circuit according to claim 3 further including a timing circuit being responsive to said output signals of both said AC/DC discernment circuit and said synchronous state machine for providing a grace timing signal to said load current comparator block, said grace timing signal having a pulse width which is dependent upon the logic state of said output signal of said AC/DC discernment circuit.

5. An AC/DC discernment circuit having an input and an output, the input being coupled to either an AC or a DC signal, comprising:

filter means having an input and an output, said input of said filter means being coupled to the input the the AC/DC discernment circuit;

a zero crossing comparator circuit having an input and an output, said input of said zero crossing comparator circuit being coupled to said output of said filter means, said output of said zero crossing comparator circuit providing a first signal, said first signal being in a first logic state when a second signal appearing at said output of said filter means is greater than a predetermined voltage, said first signal being in a second logic state when said second signal appearing at said output of said filter means is less than said predetermined voltage;

an up/down counter having an input and overflow output for sampling said first signal, said input of said up/down counter being coupled to said output of said zero crossing comparator circuit, said overflow output of said up/down counter being in a first logic state when said up/down counter has reached an all zero or all one count; and latching means having an input and an output, said input being coupled to said overflow output of said up/down counter, and said output of said latching circuit providing an output signal of said AC/DC discernment circuit indicative of whether an AC or DC signal is supplied at the input of the AC/DC discernment circuit.

6. The AC/DC discernment circuit according to claim 5 wherein said latching means includes:

a first flip flop having a clock and data input and an output, said clock input of said first flip flop being coupled to said overflow output of said up/down counter; and a second flip flop having a clock and data input and first and second outputs, said data input of said second flip flop being coupled to said output of said first flip flop, said clock input of said second flip flop being responsive to a timing signal, said second output of said second flip flop being coupled to said data input of said first flip flop, and said first output of said second flip flop being coupled to provide said output signal of said AC/DC discernment circuit.

7. A control circuit for alternately rendering a switch operative and non-operative, the switch being coupled to a load and a power supply, the switch providing a plurality of sense voltages in response to the signal level of the power supply, the control circuit comprising:
an AC/DC discernment circuit being responsive to one of the plurality of sense voltages of the switch for providing an output signal indicative of whether the power supply is providing an AC or DC signal; and
means responsive to said output signal of said AC/DC discernment circuit for providing a control signal to the switch for alternately rendering the switch operative and non-operative, said means including circuitry for comparing said plurality of sense voltages with predetermined threshold voltages for alternately rendering the switch operative and non-operative, wherein said predetermined threshold voltages have voltage levels that are a function of a logic state of said output signal of said AC/DC discernment circuit.

* * * * *